United States Patent
Johnson

(10) Patent No.: US 10,263,129 B2
(45) Date of Patent: Apr. 16, 2019

(54) MULTIJUNCTION PHOTOVOLTAIC DEVICE HAVING SIGE(SN) AND (IN)GAASNBI CELLS

(75) Inventor: Andrew Johnson, Newport (GB)

(73) Assignee: IQE PLC, Cardiff (GB)

( * ) Notice: Subject to any disclaimer, the term of this patent is extended or adjusted under 35 U.S.C. 154(b) by 980 days.

(21) Appl. No.: 14/342,061

(22) PCT Filed: Aug. 14, 2012

(86) PCT No.: PCT/GB2012/051980
§ 371 (c)(1),
(2), (4) Date: Jul. 24, 2014

(87) PCT Pub. No.: WO2013/030529
PCT Pub. Date: Mar. 7, 2013

(65) Prior Publication Data
US 2014/0326301 A1 Nov. 6, 2014

Related U.S. Application Data

(60) Provisional application No. 61/528,650, filed on Aug. 29, 2011.

(51) Int. Cl.
| | | |
|---|---|---|
| H01L 31/02 | (2006.01) | |
| H01L 29/16 | (2006.01) | |
| H01L 31/06 | (2012.01) | |
| H01L 31/0735 | (2012.01) | |
| H01L 31/0725 | (2012.01) | |
| H01L 31/074 | (2012.01) | |

(Continued)

(52) U.S. Cl.
CPC .......... *H01L 31/0328* (2013.01); *H01L 29/16* (2013.01); *H01L 29/20* (2013.01);
(Continued)

(58) Field of Classification Search
CPC ....... H01L 29/20; H01L 29/26; H01L 29/267; H01L 31/02; H01L 31/0248;
(Continued)

(56) References Cited

U.S. PATENT DOCUMENTS 5,944,913 A * 8/1999 Hou .................. H01L 31/02167
136/255
6,281,426 B1 * 8/2001 Olson ............... H01L 31/03046
136/249
(Continued)

FOREIGN PATENT DOCUMENTS

EP 1798777 A2 6/2007
GB 2467934 A 8/2010
(Continued)

OTHER PUBLICATIONS

Anwar, Sohail Handbook of Research on Solar Energy Systems and Technologies, p. 271 (Year: 2013).*
(Continued)

*Primary Examiner* — Susan D Leong
(74) *Attorney, Agent, or Firm* — Jackson Walker LLP; Christopher J. Rourk; Thomas B. Hayes

(57) ABSTRACT

A multijunction tandem photovoltaic device is disclosed having a bottom subcell of silicon germanium or silicon germanium tin material and above that a subcell of gallium nitride arsenide bismide, or indium gallium nitride arsenide bismide, material. The materials are lattice matched to gallium arsenide, which preferably forms the substrate. Preferably, further lattice matched subcells of gallium arsenide, indium gallium phosphide and aluminum gallium arsenide or aluminum indium gallium phosphide are provided.

20 Claims, 3 Drawing Sheets

| | | |
|---|---|---|
| InGaP Cell | ~1.8eV | 54 |
| GaAs Cell | ~1.4eV | 53 |
| GaNAsBi / InGaNAsBi Cell | ~1eV | 52 |
| SiGe / SiGeSn Cell | ~0.7eV | 51 |
| GaAs Substrate | p- or n-type | 50 |

(51) Int. Cl.
*H01L 31/18* (2006.01)
*H01L 31/0328* (2006.01)
*H01L 31/0687* (2012.01)
*H01L 31/0304* (2006.01)
*H01L 31/0216* (2014.01)
*H01L 29/20* (2006.01)
*H01L 29/267* (2006.01)
*H01L 31/068* (2012.01)

(52) U.S. Cl.
CPC ...... *H01L 29/267* (2013.01); *H01L 31/02167* (2013.01); *H01L 31/03044* (2013.01); *H01L 31/068* (2013.01); *H01L 31/0687* (2013.01); *H01L 31/06875* (2013.01); *H01L 31/074* (2013.01); *H01L 31/0725* (2013.01); *H01L 31/0735* (2013.01); *H01L 31/1812* (2013.01); *H01L 31/1844* (2013.01); *Y02E 10/544* (2013.01); *Y02P 70/521* (2015.11)

(58) Field of Classification Search
CPC ........... H01L 31/0256; H01L 31/03044; H01L 31/03046; H01L 31/03048; H01L 31/0687; H01L 31/06875; H01L 31/0693; H01L 31/0725; H01L 31/0735; H01L 31/074; H01L 31/18; H01L 31/1812; H01L 31/184; H01L 31/1844; H01L 31/1848
See application file for complete search history.

(56) References Cited

U.S. PATENT DOCUMENTS

| | | | | |
|---|---|---|---|---|
| 6,300,558 | B1 * | 10/2001 | Takamoto | ........... H01L 31/0735 136/249 |
| 2002/0117675 | A1 | 8/2002 | Mascarenhas | |
| 2002/0139984 | A1 * | 10/2002 | Sugawara | ............... H01L 33/08 257/79 |
| 2004/0065363 | A1 * | 4/2004 | Fetzer | ............... H01L 21/02381 136/262 |
| 2005/0155641 | A1 * | 7/2005 | Fafard | ................... B82Y 10/00 136/249 |
| 2009/0014061 | A1 | 1/2009 | Harris et al. | |
| 2010/0147366 | A1 * | 6/2010 | Stan | ................. H01L 31/06875 136/255 |
| 2011/0083729 | A1 | 4/2011 | Lee et al. | |
| 2011/0232730 | A1 | 9/2011 | Jones et al. | |
| 2011/0303273 | A1 * | 12/2011 | Harper | ................... H01L 31/18 136/255 |
| 2013/0118546 | A1 * | 5/2013 | Jones-Albertus | ....... H01L 31/06 136/244 |
| 2013/0118566 | A1 * | 5/2013 | Jones-Albertus | ....... H01L 31/06 136/255 |

FOREIGN PATENT DOCUMENTS

| | | |
|---|---|---|
| GB | 2467935 A | 8/2010 |
| WO | 2010102345 A1 | 9/2010 |
| WO | WO2010102345 A1 * | 9/2010 |

OTHER PUBLICATIONS

The International Search report and the Written opinion issued by EPO dated Dec. 5, 2012 for International patent application No. PCT/GB2012/051980.

Janotti et al., "Theoretical study of the effects of isovalent coalloying of Bi and N in GaAs" Physical Review B, 2002, vol. 65 115203-1-5.

Tixier et al., "Molecular beam epitaxy growth of $GaAs_{1-x}Bi_x$" Applied Physics Letter 2003, pp. 2245, vol. 182, No. 14.

* cited by examiner

Fig. 1

| InGaP Cell | 13 |
| GaAs Cell | 12 |
| GaInNAsSb Cell | 11 |
| GaAs Substrate | 10 |

Fig. 2

| (Al)InGaP Cell | 23 |
| (In)GaAs Cell | 22 |
| Low Sb, enhanced In and N GaInNAsSb Cell | 21 |
| Substrate (possibly including Ge Cell) | 20 |

Fig. 3

| InGaP Cell | 33 |
| GaNAs Cell | 32 |
| SiGe Cell | 31 |
| Buffer | 34 |
| Substrate | 30 |

Fig. 4

| InGaP Cell | 43 |
| GaAs Cell | 42 |
| SiGe Cell | 41 |
| GaAs Substrate | 40 |

(PRIOR ART)

| | | |
|---|---|---|
| InGaP Cell | ~1.8eV | 54 |
| GaAs Cell | ~1.4eV | 53 |
| GaNAsBi / InGaNAsBi Cell | ~1eV | 52 |
| SiGe / SiGeSn Cell | ~0.7eV | 51 |
| GaAs Substrate | p- or n-type | 50 |

Fig. 5

| | | |
|---|---|---|
| AlGaAs / AlInGaP Cell | ~2.0eV | 55 |
| InGaP Cell | ~1.8eV | 54 |
| GaAs Cell | ~1.4eV | 53 |
| GaNAsBi / InGaNAsBi Cell | ~1eV | 52 |
| SiGe / SiGeSn Cell | ~0.7eV | 51 |
| GaAs Substrate | p- or n-type | 50 |

Fig. 6

MULTIJUNCTION PHOTOVOLTAIC DEVICE HAVING SIGE(SN) AND (IN)GAASNBI CELLS

CROSS-REFERENCE TO RELATED APPLICATION

The present application is a U.S. National Phase Application of PCT Application No. PCT/GB2012/051980, published Mar. 7, 2013 as WO 2013/030529 A1, entitled "PHOTOVOLTAIC DEVICE," which claims priority to U.S. Provisional Application No. 61/528,650 filed Aug. 29, 2011, both of which are hereby incorporated by reference for all purposes.

The present invention relates to photovoltaic devices having more than one subcell for absorbing different parts of the spectrum of the incident light.

BACKGROUND

Multijunction photovoltaic devices comprise a series of subcells each having a light absorbing semiconductor material and a p-n junction therein to separate the photocarriers, to produce the photocurrent. They work by having a top subcell, i.e. that first exposed to the incident light, that has a large bandgap and so absorbs the shorter wavelengths in the incident light only and passes the longer wavelengths, with the next subcell having a smaller bandgap so that it can absorb part of the light passed by the subcell above, and so on. Solar cells are, of course, one kind of photovoltaic device and are ones used to convert sunlight into electricity for the purpose of generating power.

In this document "top" and "bottom" are to be understood in that sense, i.e. the top subcell is that which receives the incident light first in normal use, rather than the actual spatial orientation of the device. "Above" and "below" are also to be understood similarly, unless the context demands otherwise. Further light is not to be understood as visible light only. For example 1.0 eV and 0.7 eV bandgaps discussed in this document absorb light in the infra-red region.

Multijunction photovoltaic devices often use lattice matched material, which is to say that when one material is grown on another the lattice parameters of the two materials match to an extent that the crystal structure of the material being grown is maintained and strain relieving dislocations are not introduced. When the lattice parameters of the two materials, in the bulk form, are not quite equal the layer being grown becomes strained, i.e. its lattice parameter changes to match that of the layer on which it grown. Where the strain is quite small the layer being grown can be grown to an arbitrary thickness without the introduction of dislocations. The thickness at which strain relieving dislocations first appear is defined as the critical thickness for a material. In this context, the term lattice matched would also refer to strained layers grown to thicknesses below the critical thickness. Some examples of known multijunction solar cells are as follows.

US2009/00140161 (Harris) describes a triple junction solar cell as shown in FIG. 1 of the present application. The structure is an InGaP top subcell, a GaAs middle subcell and a GaInNAsSb bottom subcell, all lattice matched to a GaAs substrate. The arm stated by this document is to improve on the efficiency of a record holding InGaP/InGaAs/Ge solar subcell. For the GaInNAsSb material, it discloses, a bandgap of 0.9 to 1.3 eV and that it can be lattice matched to GaAs, which has a bandgap of 1.42 eV, so a GaInNAsSb subcell can be used to absorb the longer wavelengths passed by the GaAs subcell above it. The proposed proportions of In, N and Sb are respectively 0.05 to 0.07, 0.01 to 0.02 and 0.02 to 0.06. The document discloses experimental results comparing GaInNAsSb junctions to GaInNAs ones with the former achieving a better internal quantum efficiency and so it claims "The GaInNAsSb material system on substrate [GaAs] (FIG. 1A) represents one of the smallest bandgaps ever achieved (0.92 eV) in a dilute nitride solar subcell with high carrier collection efficiency." Further it notes a merit of a 0.92 eV bandgap which is that since there is little energy in the solar spectrum between 0.85 eV and 0.92 eV due to atmospheric absorption, subcells with just smaller bandgaps than that will not provide extra photocurrent. Later it concludes, "Since GaInNAsSb-containing devices produce sufficient current this shows that using this material, rather than Ge, as the bottom junction in a triple-junction GaInP/GaAs/GaInNAsSb device has the potential to increase the power conversion efficiency of triple junction subcells according to the invention by increasing the open-circuit voltage of the devices."

US2011/0232730 (Jones) proposes a lattice matched triple junction solar cell having a similar set of subcells to that of Harris. FIG. 2 of the present application shows this structure. Again, the proposed bottom subcell 21 is GaInNAsSb, but the material is described as "low Sb, enhanced In and N". More specifically the proposed proportions of In, N and Sb are respectively 0.07 to 0.18, 0.025 to 0.04 (higher than Harris) and 0.001 to 0.03 (generally lower than Harris). The subcells are lattice matched to the substrate. Possibilities of an Al component in the top subcell 23 and of an In component in the middle subcell 22, marked in FIG. 2, are disclosed. These enable the materials to be lattice matched to Ge, when that is the substrate. This document also proposes that when the substrate is Ge there may be a fourth subcell in that substrate.

US2011/0083729 (Lee) also discloses a triple junction solar cell. The structure of Lee is shown in FIG. 3 of the present application. Again the top subcell 33 is InGaP, but the middle subcell 32 is GaNAs and the bottom subcell 31 is SiGe. The document notes a problem with Ge bottom subcells, which is that because of the small bandgap the current produced by Ge subcells is high compared to GaAs and InGaP top and middle subcells leading to inefficiency. The SiGe actually used has a higher bandgap and produces a current that matches that of the InGaP and GaNAs top and middle subcells proposed. In this device the lattice matching is limited. In one example, the top, middle and bottom subcells are lattice matched to each other at 5.641 Å with the subcells having the following compositions $Ga_{0.544}In_{0.456}P$, $GaN_{0.0092}As_{0.9908}$, and $Si_{0.04}Ge_{0.96}$. However these subcells are not lattice matched to the substrate 30, which may be of various materials, and a metamorphic buffer layer 34 is employed to reduce the strain. This is produced by changing the composition of the buffer layer while it is grown to change the lattice parameter, which is not only a complex operation but will introduce defects into the structure.

GB2467934, also owned by the present applicant company, discloses a multijunction solar subcell, shown in FIG. 4 of the present application, which has a InGaP top subcell 43, a GaAs middle subcell 2 and a SiGe subcell 41, all lattice matched to a GaAs substrate 40.

"Theoretical study of the effects of isovalent coalloying of Bi and N in GaAs" by Janotti et al (Physical Review B, Vol. 65, 115203) of 15 Feb. 2002 discloses a theoretical study of $GaAs_{1-x-y}N_xBi_y$, which concludes that the bandgap of this material when latticed matched to GaAs could be ~1 eV.

"Molecular beam epitaxy growth of GaAs$_{1-x}$Bi$_x$" by Tixier et al (Applied Physics Letter Vol 82, No. 14 p 2245) of 7 Apr. 2003 discloses experimental results for epitaxial layers of GaAs$_{1-x}$Bi$_x$ with the proportion of Bi up to 3% and bandgaps (photoluminescence maximum) down to 1.16 eV.

SUMMARY OF INVENTION

According to the present invention there is provided a multijunction photovoltaic device comprising:
  a set of semiconductor material layers, the layers including:
    a first light absorbing layer of silicon germanium or silicon germanium tin material including a photocarrier separating p-n junction,
    a second light absorbing layer of gallium nitride arsenide bismide material, or indium gallium nitride arsenide bismide material, including a photocarrier separating p-n junction,
    wherein the silicon germanium or silicon germanium tin layer and the gallium nitride arsenide bismide, or indium gallium nitride arsenide bismide, layer are lattice matched to gallium arsenide.

The multijunction photovoltaic device may further comprise a light absorbing layer of gallium arsenide material including a photocarrier separating p-n junction.

The multijunction photovoltaic device may further comprise a light absorbing layer of indium gallium phosphide including a photocarrier separating p-n junction and being lattice matched to gallium arsenide.

The multijunction photovoltaic device may further comprise a light absorbing layer of aluminium gallium arsenide including a photocarrier separating p-n junction and being lattice matched to gallium arsenide.

The multijunction photovoltaic device may further comprise a light absorbing layer of aluminium indium gallium phosphide including a photocarrier separating p-n junction and being lattice matched to gallium arsenide.

These additional layers absorb shorter wavelengths than the silicon germanium, or silicon germanium tin, and gallium nitride arsenide bismide, or indium gallium nitride arsenide bismide, layers.

The multijunction photovoltaic device may comprise a gallium arsenide substrate, the set of layers being on and lattice matched to the substrate. Alternatively the multijunction photovoltaic may comprise a substrate that is lattice matched to gallium arsenide, the set of layers being on and lattice matched to the substrate.

The multijunction photovoltaic device may be a solar cell.

The present invention also provides a method of making a multijunction photovoltaic device comprising:
  providing a substrate of gallium arsenide or another material that is lattice matched to gallium arsenide,
  growing a first light absorbing layer of silicon germanium or silicon germanium tin material, including a photocarrier separating p-n junction, lattice matched to the substrate,
  growing a second light absorbing layer of gallium nitride arsenide bismide, or indium gallium nitride arsenide bismide, material, including a photocarrier separating p-n junction, lattice matched to the first light absorbing layer.

The method may comprise growing a light absorbing layer of gallium arsenide material, including a photocarrier separating p-n junction.

The method may comprise growing a light absorbing layer of indium gallium phosphide, including a photocarrier separating p-n junction, lattice matched to gallium arsenide.

The method may comprise growing a light absorbing layer of aluminium gallium arsenide, including a photocarrier separating p-n junction, lattice matched to gallium arsenide.

The method may comprise growing a light absorbing layer of aluminium indium gallium phosphide, including a photocarrier separating p-n junction, lattice matched to gallium arsenide.

The method may comprise providing at least one further layer between two neighbouring ones of the said light absorbing layers, the at least one further layer being lattice matched to gallium arsenide.

The method may comprise removing the substrate.

Preferably the light absorbing layers are arranged in order of bandgap. This may often mean that they are grown in order of bandgap but it would be possible to grow only some of the light absorbing layers, remove the substrate and continue growth in the other direction (a substrate usually being provided on the other side).

The light absorbing layers with their p-n junctions of the invention may, as is known in the art, each be comprised in a respective region of a multijunction photovoltaic device conventionally known as a subcell, which may have further layers.

The gallium nitride arsenide bismide, or indium gallium nitride arsenide bismide, subcell and silicon germanium, or silicon germanium tin, subcell of the invention are able between them to provide good absorption coverage of the spectral wavelengths longer than those absorbed by, for example, a gallium arsenide subcell, offering high absorption efficiency. This is in contrast of the approach of US2009/00140161 (FIG. 1) and US2011/0232730 (FIG. 2) which have only one such subcell, and in those the subcell is of a different material, namely GaInNAsSb. Further, the former document explicitly states that the goal is to have as small a bandgap as possible for the GaInNAsSb. Also, in US2011/0083729 (FIG. 3) there are GaNAs and SiGe layers that absorb in this general area of the spectrum but GaNAs cannot be lattice matched to GaAs which means that in that device a strain relieving buffer layer has to be used between its subcells and the substrate. Further this device has no subcell in the 1.4 eV region that would be provided by GaAs, and none could be provided simply because it would not lattice match the GaNAs—further, the InGaP subcell in this device would in order to lattice match GaNAs have a larger bandgap (by changing the proportion of In and Ga) than the InGaP subcell used in the examples of the present invention which is lattice matched to GaAs, leaving a large gap in the absorption spectrum of the device of US2011/0083729.

As noted above, subcells, both in the invention and as is known generally in the art, may comprise additional layers. For example, as is known in the art, tunnel contacts may be inserted between the light absorbing subcells of multijunction photovoltaic devices, and these may be so used in the present invention, to provide good electrical connection between the subcells, and to allow the p-n junction in the neighbouring subcells to have the same polarity so that current may flow through the device. Window layers and back surface field (BSF) layers, as also known in the art, are preferably also incorporated into the structure of the device of the invention. A window is usually provided at the top of each cell and a back surface field at the bottom of each subcell and these are preferably provided in the invention.

However, as noted later the invention does provide an advantage in relation to these.

BRIEF DESCRIPTION OF THE DRAWINGS

Examples of the invention will now be described, with reference to the accompanying drawings of which:

FIG. 1 shows the subcells of a first known multijunction solar cell,

FIG. 2 shows the subcells of a second known multijunction solar cell,

FIG. 3 shows the subcells of a third known multijunction solar cell,

FIG. 4 shows the subcells of a fourth known multijunction solar cell,

FIG. 5 shows the subcells of a first example of a multijunction photovoltaic device in accordance with the invention, FIG. 6 shows the subcells of a second example of a multijunction photovoltaic device in accordance with the invention.

EXAMPLES

Figure 7:
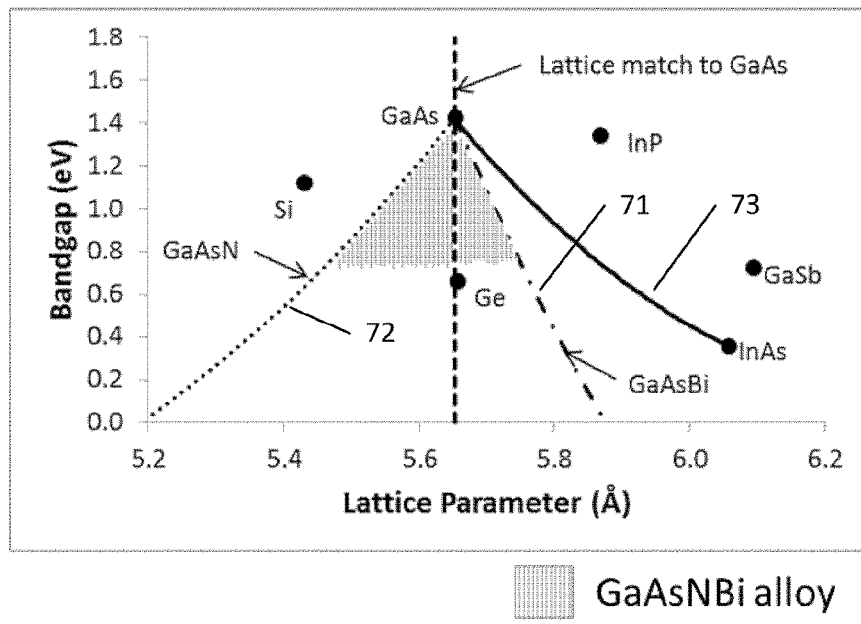
FIG. 7 is a graph showing the bandgap of GaAs and GaNAs of various compositions and the possibilities of bandgap of GaNAsBi/InGaNAsBi when lattice matched to GaAs.

FIG. 5 shows the subcells of first example of a multijunction photovoltaic device, in particular a solar cell, in accordance with the invention. This comprises a series of subcells to absorb incident light, formed on a GaAs substrate 50. The light is first incident on the subcell 54, which in this example is furthest from the substrate, with light not absorbed by each subcell passing to the next. In this example there are a top subcell 54 comprising a light absorbing layer of InGaP material, an upper middle subcell 53 comprising a light absorbing layer of GaAs 52 and a lower middle subcell comprising a light absorbing layer of GaNAsBi or InGaNAsBi material and a bottom subcell 51 comprising a light absorbing layer of SiGe material, all of which are lattice matched to a GaAs substrate 50. The light absorbing material layer of each of these subcells contains a p-n junction to separate the photocarriers generated. Preferably the cells are connected in series (tandem cell).

In this example, additional layers, which are tunnel contacts (which are provided between the subcells to provide good electrical contact), windows and back surface fields, are incorporated into the structure. These are between the subcells and above and below the light absorbing layers as appropriate. These additional layers are also lattice matched to the GaAs substrate, but as their use is well known in the art and for simplicity of illustration these layers not shown in FIG. 5 (similarly for FIG. 6). Because all the layers are lattice matched, including to the substrate, this reduces the cost of manufacture and enhances device performance, reliability and yield. Another advantage of this example is the ability, compared to devices having a Ge substrate with a light absorbing subcell in that, to put a back surface field (BSF) below the p-n junction of SiGe bottom sub-cell for enhanced device performance. Additionally, a sacrificial release layer that has a differential etch rate to GaAs may be grown below the SiGe subcell. This permits the epitaxial layer structure containing the subcells to be removed from the GaAs substrate and transferred to a suitable handle or heat sink, allowing the GaAs substrate to be re-used and if needed reducing the weight of the device. These additional layers are grown epitaxially on the GaAs substrate before the SiGe subcell is grown. Alternatively the subcells may be grown in reverse order on a GaAs substrate (or a substrate lattice matched to GaAs) starting with the widest bandgap (the InGaP subcell in the case of FIG. 5) and then followed by the narrower bandgap subcells in order (the GaAs subcell, then the GaNAsBi/InGaNAsBi subcell and then the SiGe/SiGeSn subcell in the case of FIG. 5). A sacrificial layer is provided between the widest bandgap subcell and the GaAs substrate allowing the subcells to be removed and transferred to a suitable handle or heat sink, inverted so that the narrowest bandgap cell is next to the handle or heart sink and the widest bandgap cell receives the incident light first.

The composition of the light absorbing GaNAsBi layer of subcell 52 is such that its bandgap is preferably in the range $0.8 < E_g < 1.2$ eV. A bandgap of around 1.0 eV is particularly advantageous since it fills the gap between the parts of the spectrum absorbed by the SiGe and GaAs layers.

FIG. 7 is a graph showing the bandgap of various Group III-V semiconductor materials and Group IV materials versus their lattice parameter. There are of course numerous III-V materials but the ones shown are selected either to illustrate the GaNAsBi/InGaNAsBi material used in the light absorbing layer of subcell 52 of the invention or for general comparison with well-known materials. In particular a dot-dashed line 71 extends between the point for GaAs and the point for GaBi (off the graph as it has a negative bandgap) giving the values for the ternary compound $GaAs_{1-y}Bi_y$ as the proportion y of Bi atoms varies. Dotted line 72 extending from the point for GaAs towards that for GaN, which is off the graph shown at a smaller lattice parameter, giving the values for the ternary compound $GaAs_{1-x}N_x$ as the proportion x of N atoms varies. This Figure shows that the substitution of a proportion the As atoms in GaAs by either N or Bi to GaAs reduces the bandgap (even to the range of that of Ge—while it is not practical to add more than a few percent of N that is sufficient to reach the bandgap of Ge). However substituting in N reduces the lattice parameter, while substituting in Bi increases the lattice parameter. It turns out that substituting in both N and Bi for As, i.e. to form the quaternary material $GaN_xAs_{1-x-y}Bi_y$, still causes the bandgap to decrease from that of GaAs and with certain proportions of N and Bi the material is lattice matched to GaAs (the effects on lattice parameter of N and Bi cancelling each other out). An exact lattice match to GaAs is shown by the vertical dashed line, but strained materials having layer thicknesses below the critical thickness are also possible and lie to either side of the dashed line. The shaded area shows possibilities for the quaternary GaNAsBi having bandgaps of the most interest in the invention. Note, in particular, that the region neighbouring the dashed vertical line (which is the lattice matched region) that is within the shaded area also does include bandgaps in the region of 1 eV between that of SiGe (around 0.7 eV) and GaAs (around 1.4 eV).

FIG. 7 also shows a solid line 73 for the ternary material $In_zGa_{1-z}As$. This shows that the effect of In is to reduce the bandgap from GaAs while increasing the lattice parameter. In those respects its effect is similar to that of Bi, so both Bi and In can be used to balance the lattice parameter against the effect of N to provide a lattice match to GaAs, while all three (Bi, In and N) reduce the bandgap from that of GaAs. So the material $In_zGa_{1-z}N_xAs_{1-x-y}Bi_y$ used in some of the examples of the invention given above also provides a lattice match to GaAs for a range of bandgaps between those of GaAs and SiGe/SiGeSn.

The precise proportions of N and Bi in the GaNAsBi for a particular bandgap and lattice matching can of course be experimentally determined easily for any particular case. However for lattice matching to GaAs the ratio of N to Bi is about 1:1.7. For bandgaps equal to GaAs (1.4 eV) down to 0.9 eV the respective proportion of N and Bi, x and y, in the material lie in the range 0<x<6% and 0<y<11%.

For the material $In_zGa_{1-z}N_xAs_{1-x-y}Bi_y$ used in some of the examples above the range for the proportion of In, z, is 0<z<15%, with the ranges for the proportions of N and Bi being as noted above for $GaN_xAs_{1-x-y}Bi_y$.

Figure 8:
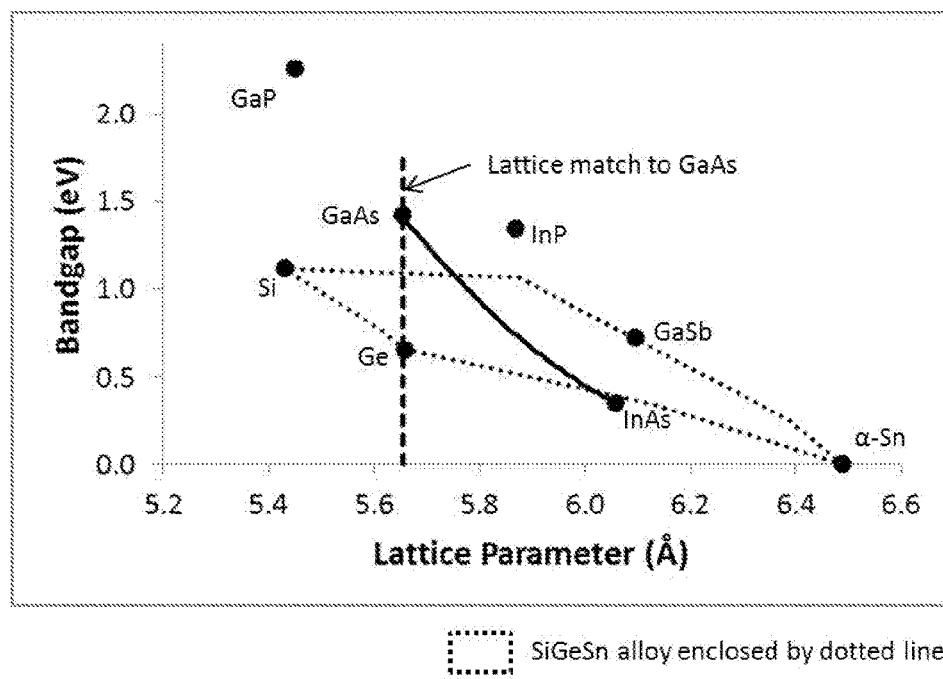
FIG. 8 is a graph showing the bandgap and lattice parameter of the alloy SiGeSn, showing that it can be lattice matched to GaAs with a bandgap range of 0.66-~1.1 eV.

To make the SiGe light absorbing layer in subcell 51 lattice matched to GaAs the proportion of silicon is around 0.018 and this material then has a bandgap of around 0.7 eV. As can be seen in FIG. 8, which is another graph showing the bandgap of various Group III-V semiconductor materials and Group IV materials versus their lattice parameter, Ge is not lattice matched to GaAs but as the difference is not large only a small amount of Si needs to be added to achieve the lattice matching. Since SiGe is a binary compound there is only one degree of freedom provided by the proportion of the atoms and so the bandgap is fixed at around 0.7 eV if the lattice match to GaAs is to be maintained.

However, if desired a larger bandgap can be obtained for subcell 51 by using SiGeSn instead of SiGe. This material is lattice matched to GaAs where the ratio of Si to Sn is approximately 4:1. Where for example the proportion of Si is 2% and that of Sn is 0.5% this provides a larger bandgap than SiGe lattice matched to GaAs, where the proportion of Si is 8% and that of Sn is 2% the bandgap is wider, and where the proportions are much larger the bandgap can extend further.

FIG. 6 shows the subcells of a second example of the invention. This device is as that of FIG. 5 but it has an additional subcell 55 having a light absorbing layer and a photocarrier separating p-n junction located above the InGaP subcell 54. This subcell 55 absorbs part of the spectrum above around 2.0 eV and allows longer wavelengths to be absorbed by the InGaP subcell 54 and the subcells below that. The material of the light absorbing layer of this subcell 55 in this example is AlGaAs having a proportion of Al and Ga having the desired bandgap. This material is lattice matched to GaAs, although strained, at all proportions of Al to Ga, and can be grown to thicknesses required for a photovoltaic device to have sufficient absorption without any strain relaxation.

In another similar example the light absorbing material layer of subcell 55 is AlInGaP lattice matched to GaAs. Again the bandgap of is preferably about 2.0 eV but since the material is a quaternary some extra flexibility is obtained.

The subcells examples of FIGS. 5 and 6 described above do not, as is preferred, have further subcells between them. That is however possible with preferably the bandgaps of the light absorbing materials of the intervening subcells being between that of their neighbours.

Note also that while the substrate of the examples is GaAs the invention also extends to cases where the substrate on which the subcells are grown is another material that is lattice matched to GaAs.

Note further that if not needed for certain applications any one or more of subcells 53, 54 or 55 can be omitted.

The materials of the subcells may be grown using epitaxial techniques including MBE and MOCVD.

For example, GB2467934, also owned by the present applicant company and mentioned above, discloses examples of SiGe materials manufactured on GaAs substrates. The document is incorporated herein by reference. These materials can be grown using an epitaxy process, using a germanium containing precursor (e.g $GeH_4$, $GeCl_4$, etc.) and a silicon containing precursor (e.g. $SiH_4$, $SiH_2Cl_2$, $SiHCl_3$, disilane etc.) with a carrier gas (e.g. $H_2$). The p-n junction used to separate the photo carriers may be formed in the SiGe material by various methods. These include doping during the epitaxial growth, or by diffusion in of dopant into a layer of the material when it is grown or is partially grown. An alternative method is given below.

The SiGe or SiGeSn material used in subcell 51 will in many examples have III-V material directly grown on it. There may then be diffusion of Group V atoms from the III-V material into the SiGe or SiGeSn. Arsenic atoms, for example, will do this. Arsenic in SiGe or SiGeSn is an n-type dopant.

So if the SiGe or SiGeSn neighbouring the III-V material grown on it is p-type then the Group V atoms diffusing into the SiGe or SiGeSn may well dope the SiGe or SiGeSn forming a p-n junction below the surface of the SiGe or SiGeSn. (If this junction were to be parasitic in a particular example it can be prevented or controlled by forming a thin Si diffusion barrier between the SiGe or SiGeSn. Three atomic layers is sufficient.) However, as foreshadowed, the junction so formed can be utilised as the photocarrier separating junction in the SiGe or SiGeSn subcell. Alternatively it may be used as a tunnel diode between the SiGe or SiGeSn subcell and the subcell grown on that. A thinner Si barrier can be used to control the amount of diffusion if that is desired.

On the other hand if the SiGe or SiGeSn neighbouring III-V material grown on it is n-type (i.e. an epitaxially grown SiGe or SiGeSn p-n junction) the diffusion in of Group V atoms will not form an extra p-n junction.

The GaNAsBi/InGaNAsBi layer of the invention is also formed by epitaxy. The p-n junction for separating the photocarriers therein is formed either by doping during the epitaxial growth, or, alternatively, after the layer, or part thereof has been grown and diffusing the dopant in. This material could be grown by any epitaxial process such as MBE, MOCVD etc.

GB2467934, and also GB2467935 also owned by the present applicant, describe techniques that may be employed in the present invention to remove the GaAs substrate from the rest of the device. Those documents are therefore incorporated by reference. This is useful, for example, to reduce weight of the device (useful for space applications), to allow a heat sink to be bonded to the device or to allow the substrate to be re-used to reduce cost.

The GaAs substrate may be removed when all the subcells have been grown in order on it (which may be in either order). Alternatively the GaAs substrate can be removed at any point during the growth and that may be part way through a subcell including partway through the just one cell. In these methods a new substrate is mounted on the just grown surface.

The invention claimed is:

1. A method of making a multijunction photovoltaic device comprising:
   providing a substrate of gallium arsenide or another material that is lattice matched to gallium arsenide;

growing a first light absorbing layer of silicon germanium or silicon germanium tin material, including a photocarrier separating p-n junction, lattice matched to the substrate;

growing a second light absorbing layer of gallium nitride arsenide bismide material, or indium gallium nitride arsenide bismide material, including a photocarrier separating p-n junction, lattice matched to the first light absorbing layer, the photocarrier separating p-n junction of the second light absorbing layer having an associated bandgap energy which is between 0.8 eV and 1.2 eV;

growing a third light absorbing epitaxial layer, including it photocarrier separating p-n junction, lattice matched to the second light absorbing layer, the photocarrier separating p-n junction having an associated bandgap energy of ~1.4 eV, the third light absorbing layer being a layer of gallium arsenide material; and growing a fourth light absorbing epitaxial layer, including a photocarrier separating p-n junction, lattice matched to the third light absorbing layer, the photocarrier separating p-n junction having an associated bandgap energy; and wherein the bandgap energy of the first light absorbing layer is lower than the bandgap energy of the second light absorbing layer, which is lower than the bandgap energy of the third light absorbing layer, which is lower than the bandgap energy of the fourth light absorbing layer; and all of the first light absorbing layer, second light absorbing layer, third light absorbing layer and fourth light absorbing layer are lattice matched to gallium arsenide.

2. A method as claimed in claim 1 wherein the second layer is of gallium nitride arsenide bismide material.

3. A method as claimed in claim 1 wherein the second layer is of indium gallium nitride arsenide bismide material.

4. A method as claimed in claim 1 comprising growing a light absorbing layer of indium gallium phosphide, including a photocarrier separating p-n junction, lattice matched to gallium arsenide.

5. A method as claimed in claim 1 comprising growing a light absorbing layer of aluminium gallium arsenide, including a photocarrier separating p-n junction, lattice matched to gallium arsenide.

6. A method as claimed in claim 1 comprising growing a light absorbing layer of aluminium indium gallium phosphide, including a photocarrier separating p-n junction, lattice matched to gallium arsenide.

7. A method as claimed in claim 1 comprising providing at least one further layer between two neighbouring ones of the said light absorbing layers, the at least one further layer being lattice matched to gallium arsenide.

8. A method as claimed in claim 1 comprising removing the substrate.

9. A method as claimed in claim 1 wherein the fourth light absorbing layer is a layer of indium gallium phosphide.

10. A method as claimed in claim 1 comprising:
growing a fifth light absorbing layer, including a photocarrier separating p-n junction, lattice matched to gallium arsenide, the fifth layer having an associated bandgap energy and wherein the bandgap energy of the fifth layer is greater than that of the fourth layer.

11. A method as claimed in claim 10 wherein:
the fourth light absorbing layer is a layer of indium gallium phosphide, and
the fifth light absorbing layer is a layer of aluminium gallium arsenide or aluminium indium gallium phosphide.

12. A method as claimed in claim 1 wherein the substrate is of gallium arsenide.

13. A method as claimed in claim 1 wherein lattice matching is achieved by maintaining the same lattice parameter in each of the layers.

14. A method as claimed in claim 1 wherein lattice matching is achieved without transition layers.

15. A method as claimed in claim 1 wherein lattice matching is achieved by control of alloy fractions.

16. A method of making a multijunction photovoltaic device comprising:
providing a substrate of gallium arsenide or another material that is lattice matched to gallium arsenide;
growing a first light absorbing layer of silicon germanium or silicon germanium tin material, including a photocarrier separating p-n junction, lattice matched to the substrate; and
growing a second light absorbing layer of gallium nitride arsenide bismide material, or indium gallium nitride arsenide bismide, material, including a photocarrier separating p-n junction, lattice matched to the first light absorbing layer, wherein lattice matching is achieved by control of alloy fractions to maintain the same lattice parameter in each of the layers.

17. The method of claim 16, whereby the lattice matching is achieved without the need for transition layers.

18. The method of claim 16, wherein the photocarrier separating p-n junction of the second light absorbing layer has an associated bandgap energy which is between 0.8 eV and 1.2 eV.

19. The method of claim 16, further comprising growing a third light absorbing epitaxial layer, including a photocarrier separating p-n junction, lattice matched to the second light absorbing layer, the photocarrier separating p-n junction having an associated bandgap energy of ~1.4 eV, the third light absorbing layer being a layer of gallium arsenide material.

20. The method of claim 19, further comprising growing a fourth light absorbing epitaxial layer, including a photocarrier separating p-n junction, lattice matched to the third light absorbing layer, the photocarrier separating p-n junction having an associated bandgap energy.

* * * * *